US009892884B2

(12) United States Patent
Yi et al.

(10) Patent No.: US 9,892,884 B2
(45) Date of Patent: Feb. 13, 2018

(54) EXPOSURE APPARATUS AND METHOD OF MANUFACTURING SEMICONDUCTOR DEVICE

(71) Applicant: Samsung Electronics Co., Ltd., Suwon-si (KR)

(72) Inventors: Rae-Won Yi, Suwon-si (KR); Byoung-Sup Ahn, Seongnam-si (KR); Dong-Gun Lee, Hwaseong-si (KR); Su-Young Lee, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/157,407

(22) Filed: May 18, 2016

(65) Prior Publication Data

US 2017/0053773 A1 Feb. 23, 2017

(30) Foreign Application Priority Data

Aug. 20, 2015 (KR) .................. 10-2015-0117198

(51) Int. Cl.
*H01J 37/00* (2006.01)
*H01J 37/02* (2006.01)
*H01J 37/244* (2006.01)
*H01J 37/20* (2006.01)

(52) U.S. Cl.
CPC ............ *H01J 37/023* (2013.01); *H01J 37/20* (2013.01); *H01J 37/244* (2013.01); *H01J 2237/20285* (2013.01); *H01J 2237/24578* (2013.01)

(58) Field of Classification Search
CPC ........ H01J 37/023; H01J 37/20; H01J 37/244; H01J 2237/20285; H01J 2237/24578
USPC .......................................... 250/492.1, 492.2
See application file for complete search history.

(56) References Cited

U.S. PATENT DOCUMENTS

| 8,964,173 | B2  |    | 2/2015  | Ahn et al.   |            |
|-----------|-----|----|---------|--------------|------------|
| 2013/0168569 | A1 | *  | 7/2013  | Yamaguchi    | B82Y 40/00 |
|           |     |    |         |              | 250/395    |
| 2014/0320836 | A1 |    | 10/2014 | Yamaguchi et al. |      |
| 2015/0001423 | A1 |    | 1/2015  | Meijer et al. |           |
| 2015/0041672 | A1 |    | 2/2015  | Kamikubo     |            |
| 2015/0155136 | A1 |    | 6/2015  | Scheffers    |            |

FOREIGN PATENT DOCUMENTS

JP 2014-052403 3/2014
KR 10-1050285 7/2011

\* cited by examiner

*Primary Examiner* — Nicole Ippolito
*Assistant Examiner* — Hanway Chang
(74) *Attorney, Agent, or Firm* — Muir Patent Law, PLLC

(57) ABSTRACT

An exposure apparatus comprising, a stage configured to receive a substrate, a mark array disposed on the stage and comprising a first mark and a second mark separated from each other by a first distance, a first beam irradiator configured to irradiate a first beam to the first mark, a second beam irradiator being separated from the first beam by a pitch greater than the first distance and configured to irradiate a second beam to the second mark, a detector disposed over the mark array and configured to receive a third beam reflected by the first mark and a fourth beam reflected by the second mark, and a controller configured to control the position of the stage using an output of the detector.

16 Claims, 12 Drawing Sheets

EXPOSURE APPARATUS AND METHOD OF MANUFACTURING SEMICONDUCTOR DEVICE

This application claims priority to Korean Patent Application No. 10-2015-0117198 filed on Aug. 20, 2015 with the Korean Intellectual Property Office, the disclosure of which is incorporated herein by reference in its entirety.

BACKGROUND

1. Technical Field

Exemplary embodiments of the present disclosure relate to an exposure apparatus, and to an exposure apparatus including a plurality of beam irradiators.

2. Description of the Related Art

As substrates gradually become larger in size and their patterns become finer, a maskless exposure apparatus for forming a desired pattern on a substrate (or a semiconductor wafer) without using a photomask is being developed. Maskless exposure has various advantages. First of all, the cost of manufacturing, cleaning, and keeping a mask is not required, and a panel can be designed freely. In addition, since no time is required to manufacture a mask, a lead time can be reduced. Further, a process loss does not occur due to the absence of a mask defect, and production flexibility can be increased by the application of a hybrid layout.

The maskless exposure apparatus forms a pattern by transferring a spot beam onto a substrate (glass) using pattern information which is generated as a control signal using a spatial light modulator (SLM) such as a digital micro-mirror device (DMD).

SUMMARY

Exemplary embodiments of the present disclosure provide an exposure apparatus which may reduce the time for correcting positions of a plurality of beam irradiators.

Exemplary embodiments of the present inventive concepts also provide a stage including a mark array, which may reduce the time for correcting positions of a plurality of beam irradiators.

According to an exemplary embodiment of the present inventive concepts, an exposure apparatus comprises a stage configured to receive a substrate, a mark array disposed on the stage and comprising a first mark and a second mark separated from each other by a first distance, a first beam irradiator configured to irradiate a first beam to the first mark, a second beam irradiator configured to irradiate a second beam, which is separated from the first beam by a pitch greater than the first distance, to the second mark, a detector disposed over the mark array and configured to receive a third beam reflected by the first mark and a fourth beam reflected by the second mark, and a controller configured to control a position of the stage using an output of the detector.

According to an exemplary embodiment of the present inventive concepts, an exposure apparatus comprises a stage comprising, a substrate region configured to receive a substrate, a first region on which a first mark is disposed and configured to receive a first beam, a second region disposed adjacent to the first region, thereon which a second mark separated from the first mark is disposed, and configured to receive a second beam separated from the first beam by a predetermined pitch, and a mark array region which comprises the first region and the second region, wherein the first mark and the second mark are separated from each other by a first distance smaller than the predetermined pitch between the first beam and second beam, and at least one of the first region and the second region has a width corresponding to the predetermined pitch between the first beam and second beam.

According to an exemplary embodiments, an exposure apparatus comprise a stage including a substrate region and a mark region, the mark region including a first mark and a second mark, a plurality of beam irradiators including a first beam irradiator and a second beam irradiator, the first and second beam irradiators being configured to scan the first and second marks respectively, a detector configured to detect scanned image information of the first and second marks, and a controller configured to receive the scanned image information from the detector and to determine a shift value of the stage with respect to the plurality of beam irradiators.

The exposure apparatus may further comprises a transfer unit configured to move the stage, wherein the controller may be configured to control the transfer unit to move the stage to correct the determined shift value of the stage. The plurality of beam irradiators may be configured to scan a substrate disposed on the substrate region after the stage position is corrected by the controller. The scanning width of the first irradiator may be larger than the width of the first mark. The first mark and second mark may be completely separated from each other.

However, exemplary embodiments of the present inventive concepts are not restricted to the one set forth herein. The above and other Exemplary embodiments of the present inventive concepts will become more apparent to one of ordinary skill in the art to which the present inventive concepts pertains by referencing the detailed description of the exemplary embodiments of the present inventive concepts given below.

Other features and aspects will be apparent from the following detailed description, the drawings, and the claims.

DETAILED DESCRIPTION

Figure 1:
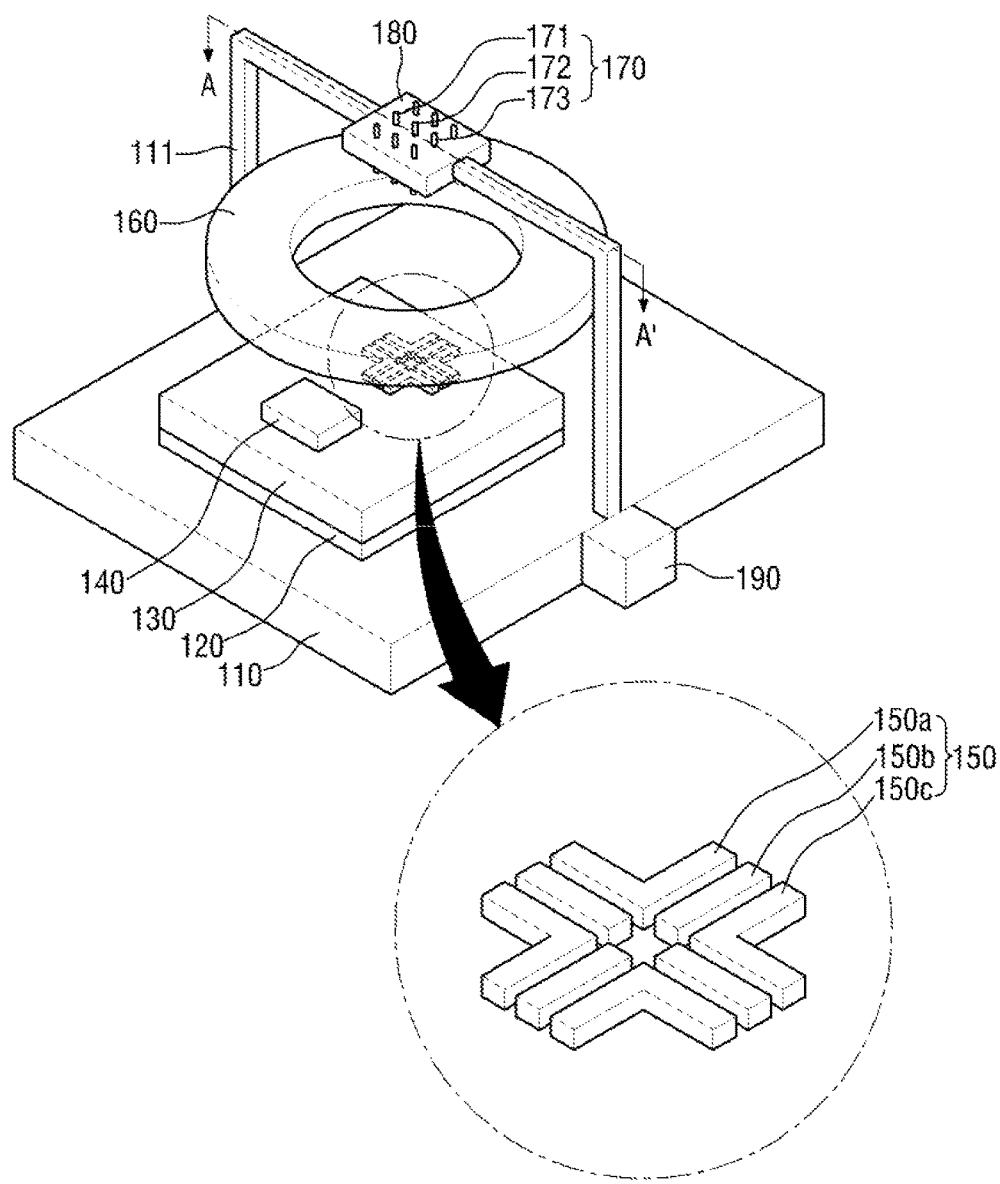
FIG. 1 is a perspective view of an exposure apparatus according to an exemplary embodiment of the present inventive concepts.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to a direct connection (i.e., touching) unless the context indicates otherwise.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device.

The plurality of device structures may be arranged in an array and/or in a two-dimensional pattern.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

An exposure apparatus according to an exemplary embodiment of the present inventive concepts will now be described with reference to FIGS. 1 and 2.

FIG. 1 is a perspective view of an exposure apparatus 100 according to an exemplary embodiment of the present inventive concepts. FIG. 2 is a cross-sectional view taken along the line A-A' of FIG. 1.

Figure 2:
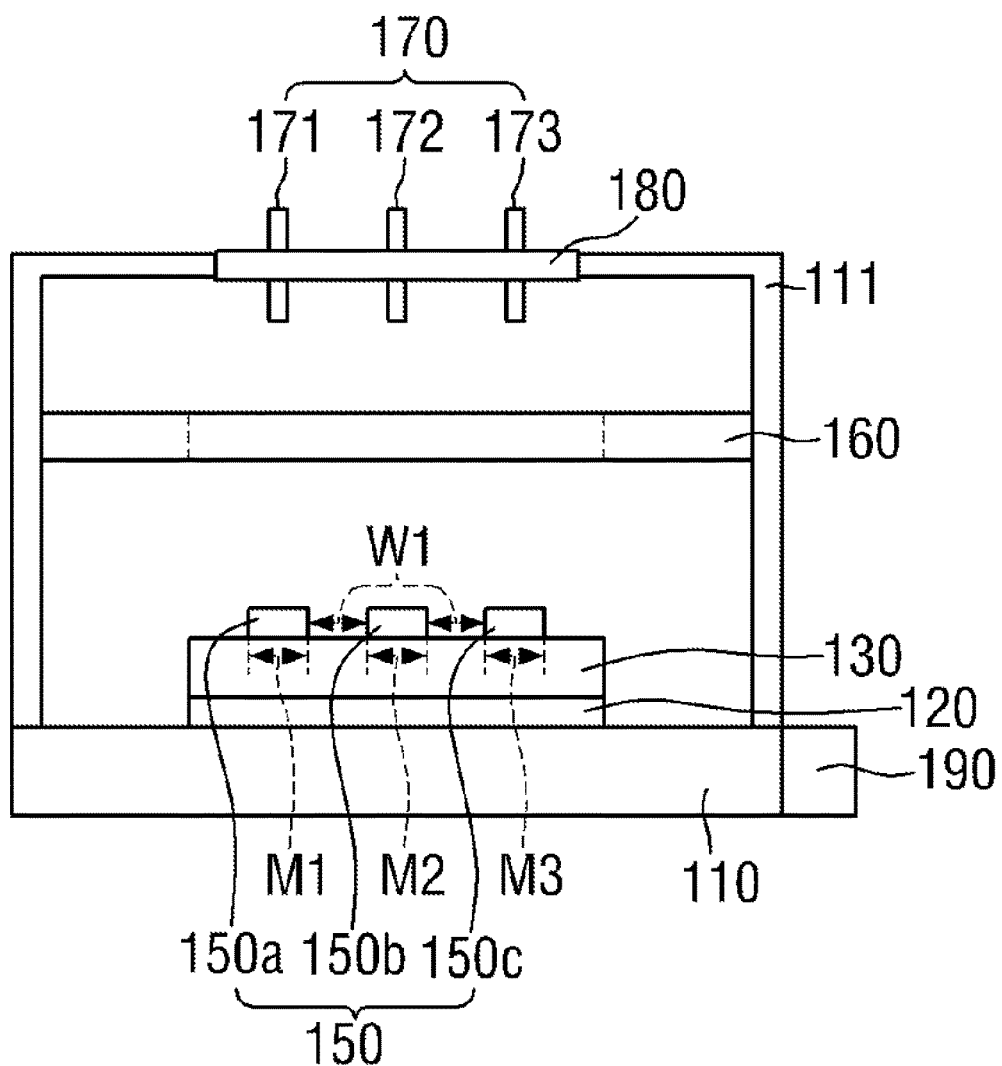
FIG. 2 is a cross-sectional view taken along the line A-A' of FIG. 1.

Referring to FIGS. 1 and 2, the exposure apparatus 100 may include a base frame 110, a connection frame 111, a transfer unit 120, a stage 130, a mark array 150, a detector 160, a plurality of beam irradiators 170, a beam irradiator fixing frame 180, and a controller 190.

The base frame 110 may be disposed in a lower portion of the exposure apparatus 100 and support the entire exposure apparatus 100. However, the inventive concepts are not limited thereto. For example, even though the base frame 110 is disposed in a lower portion of the exposure apparatus 100 in FIG. 1, the base frame 110 may be disposed on a side surface of the exposure apparatus 100 or may be disposed on an upper portion of the exposure apparatus 100 in some other embodiments.

The connection frame 111 may be disposed on the base frame 110 and support the beam irradiators 170 and the detector 160. For example, the connection frame 111 may be disposed on an upper surface, on side surfaces, or on a bottom surface of the base frame 110. However, the inventive concepts are not limited thereto. In some embodiments, the connection frame 111 may be separated from the base frame 110.

The transfer unit 120 may be disposed on the base frame 110. The transfer unit 120 may move the stage 130 on the base frame 110. Accordingly, the transfer 120 can position the mark array 150 or a substrate 140 under the beam irradiators 170.

After positions of the beam irradiators 170 are corrected, the transfer unit 120 may position the substrate 140 under the beam irradiators 170 by moving the stage 130. A method of correcting the positions of the beam irradiators 170 using the controller 190 will be described later.

The stage 130 may be disposed on the transfer unit 120. However, the inventive concepts are not limited thereto. For example, even though the stage 130 is disposed on the base frame 110 in FIG. 1, the stage 130 may be disposed on or coupled to a side surface of the base frame 110 in some other embodiments. Alternatively, in some exemplary embodiments of the present inventive concepts, the stage 130 may be disposed on or coupled to a side surface of the transfer unit 120.

The stage 130 may include a substrate region and a mark array region. The stage 130 may be configured to receive the substrate 140. For example, the substrate 140 may be disposed on the substrate region of the stage 130, and the mark array 150 may be disposed on the mark array region of the stage 130.

The mark array 150 may be disposed on the stage 130 and include a number of marks corresponding to the number of the beam irradiators 170. The mark array 150 may have a two-dimensional (2D) structure in which the marks are arranged at regular intervals. For example, the beam irradiators 170 may be configured to irradiate beams to the mark array 150 which may be used to detect a relative position between the beam irradiators 170 and the stage 130.

In FIG. 1, the exposure apparatus 100 includes one mark array 150. However, the inventive concepts are not limited thereto. For example, in some other embodiments, an exposure apparatus may include a plurality of mark arrays. In the exposure apparatus including a plurality of the mark arrays, when the life of a mark array being used ends, another mark array may be used without the replacement of the mark array.

The mark array 150 may include first through third marks 150a through 150c. The first through third marks 150a through 150c may be disposed on the mark array region of the stage 130.

The first and second marks 150a and 150b may be separated by a first pitch W1, and the second and third marks 150b and 150c may be separated by the first pitch W1. However, the inventive concepts are not limited thereto. For example, in some other embodiments, a pitch between the first and second marks 150a and 150b may be different from a pitch between the second and third marks 150b and 150c. In this case, each of the pitch between the first and second marks 150a and 150b and the pitch between the second and third marks 150b and 150c may be smaller than a second pitch (R1, R2 or R3 in FIG. 6). The first pitch W1 described throughout this disclosure, may also be referred to as a first gap or a first distance W1. The pitches between the marks 150a, 150b and 150c described throughout this disclosure, may also be referred to as gaps or distances. The first and second marks may be completely separated as seen in FIG. 1. In some other example, the first and second marks may not be completely separated as will be seen in later embodiment, for example, as in FIG. 11. For example, the first and second marks may be connected.

A width M1 of the first mark 150a, a width M2 of the second mark 150b, and a width M3 of the third mark 150c may be equal. However, the inventive concepts are not limited thereto. For example, in some exemplary embodiments of the present inventive concepts, at least one of the width M1 of the first mark 150a, the width M2 of the second mark 150b, and the width M3 of the third mark 150c may be different from the others.

In FIG. 2, each of the first through third marks 150a through 150c has a quadrilateral cross-sectional shape. However, the inventive concepts are not limited thereto. For example, in some exemplary embodiments of the present inventive concepts, the cross-section of each mark may have a polygonal or semi-circular shape other than the quadrilateral shape.

Each mark included in the mark array 150 may include a metal that can reflect a beam of light or electron, such as for example, at least one of Ta, W, Pt, Au and Pb. The mark array 150 may reflect beams irradiated by the beam irradiators 170 or electrons irradiated by the beam irradiators 170. The position of the mark array 150 can be measured using the beams or electrons reflected by the mark array 150.

The detector 160 may be disposed above the stage 130 to be separated from the stage 130. Specifically, the detector 160 may be disposed between the stage 130 and the beam irradiators 170. However, the inventive concepts are not limited thereto. For example, in some embodiments, the detector 160 may be disposed on or above the beam irradiators 170 or on side surfaces of the beam irradiators 170. In some other embodiments, the detector 160 may be directly connected to the stage 130. In this case, the detector 160 may be separated from the mark array 150 so as to receive beams or electrons reflected by the mark array 150.

The detector 160 may be directly connected to the connection frame 111. However, the inventive concepts are not limited thereto. For example, in some other embodiments, the detector 160 may not be directly connected to the connection frame 111.

The detector 160 may be disposed between the beam irradiators 170 and the stage 130. For example, the detector 160 may be shaped like a disk having an opening such that it is not placed on a beam path. Accordingly, the detector 160 may not receive beams or electrons irradiated by the beam irradiators 170 but may receive beams or electrons reflected by the mark array 150.

The detector 160 may receive beams or electrons reflected by the mark array 150 and transmit position information of the mark array 150 to the controller 190. The detector 160 may be separated from the controller 190. However, the inventive concepts are not limited thereto. For example, in some other embodiments, the detector 160 may be directly connected to the controller 190.

The beam irradiators 170 may be disposed on the stage 130, and the number of the beam irradiators 170 may correspond to the number of marks included in the mark array 150. The beam irradiators 170 may be arranged at regular intervals in a two dimensional (2D) structure.

The beam irradiators 170 may include first through third beam irradiators 171 through 173. Pitches among the first through third beam irradiators 171 through 173 may be equal. Similarly, pitches among, or distances between the first through third beams L1, L2, and L3 may be equal. However, the inventive concepts are not limited thereto. For example, in some other embodiments, a pitch between the first and second beam irradiators 171 and 172 may be different from a pitch between the second and third beam irradiators 172 and 173.

The second pitch (R1, R2 or R3 in FIG. 6) may be greater than the width M1 of the first mark 150a, the width M2 of the second mark 150b, and the width M3 of the third mark 150c. For example, the second pitch (R1, R2 or R3 in FIG. 6) may be equal to the sum of the first pitch W1 and the width M1 of the first mark 150a, the sum of the first pitch W1 and the width M2 of the second mark 150b, and the sum of the first pitch W1 and the width M3 of the third mark 150c. The second pitch (R1, R2 or R3) described throughout this disclosure may also be referred to as "scanning distance" or "scanning width" R1, R2 or R3 of an irradiator 171, 172 or 173.

The beam irradiators 170 may be fixed by the connection frame 111 while their positions are being corrected. For example, the beam irradiators 170 may be fixed by the connection frame 111 while the substrate 140 is being exposed to light. For example, the beam irradiators 170 may be fixed in position by the connection frame 111 during an exposure process.

The beam irradiators 170 may irradiate beams or electrons to the mark array 150. The beams or electrons irradiated by the beam irradiators 170 may be provided to marks corresponding to the beam irradiators 170, respectively. For example, the first beam irradiator 171 may irradiate a beam or electrons to the first mark 150a, the second beam irradiator 172 may irradiate a beam or electrons to the second mark 150b, and the third beam irradiator 173 may irradiate a beam or electrons to the third mark 150c. The beams irradiated from the first beam irradiator 171 through the third beam irradiator 173 may have a predetermined pitch between the beams. For example, the distance between the beam irradiated from the first beam irradiator 171 and the beam irradiated from the second beam irradiator 172 may be substantially the same as the distance between the beam irradiated from the second beam irradiator 172 and the beam irradiated from the third beam irradiator 173. In some other embodiments, the distances between adjacent beams may be different from each other.

The motion of beams or electrons irradiated from the beam irradiators 170 to the mark array 150 will be described later.

The beam irradiator fixing frame 180 may include the beam irradiators 170 that penetrate therethrough. Respective ends of the beam irradiators 170 may protrude from an upper surface of the beam irradiator fixing frame 180. The other respective ends of the beam irradiators 170 may protrude from a lower surface of the beam irradiator fixing frame 180.

The beam irradiator fixing frame 180 may be disposed on the stage 130. The beam irradiator fixing frame 180 may be directly connected to the connection frame 111. Accordingly, the beam irradiators 170 may be fixed to the beam irradiator fixing frame 180.

The controller 190 may be disposed on a side surface of the base frame 110 as illustrated in FIGS. 1 and 2. However, the inventive concepts are not limited thereto. For example, the controller 190 may be disposed in another place. The position of the controller 190 may not be limited to a particular position.

The controller 190 may receive the position information of the mark array 150 from the detector 160. In some embodiments, the controller 190 may calculate a central position of the beam irradiators 170 using the position information of the mark array 150.

The controller 190 may correct the positions of the beam irradiators 170 using the calculated central position of the beam irradiators 170. For example, when the transfer unit 120 is operated to position the substrate 140 under the beam irradiators 170, the controller 190 may correct the positions of the beam irradiators 170 by controlling the transfer unit 120 using the central position of the beam irradiators 170.

The exposure apparatus 100 according to the present exemplary embodiment of the present inventive concepts can obtain the position information of the mark array 150 by irradiating a beam or electrons to a mark, which corresponds to each of the beam irradiators 170, using each of the beam irradiators 170. Therefore, a width of a region to which each beam irradiator 170 irradiates a beam or electrons may be relatively small. Consequently, the exposure apparatus 100 is advantageous in an exposure process in that it can reduce the time required to scan the mark array 150 so as to correct the positions of the beam irradiators 170.

An exposure apparatus according to exemplary embodiments of the present inventive concepts can be used in a mask exposure apparatus. However, the inventive concepts are not limited thereto. For example, in some other embodiments, the exposure apparatus according to embodiments of the present inventive concepts can be used in a maskless exposure apparatus.

The 2D arrangement of a plurality of beam irradiators according to exemplary embodiments of the present inventive concepts will now be described with reference to FIG. 3.

Figure 3:
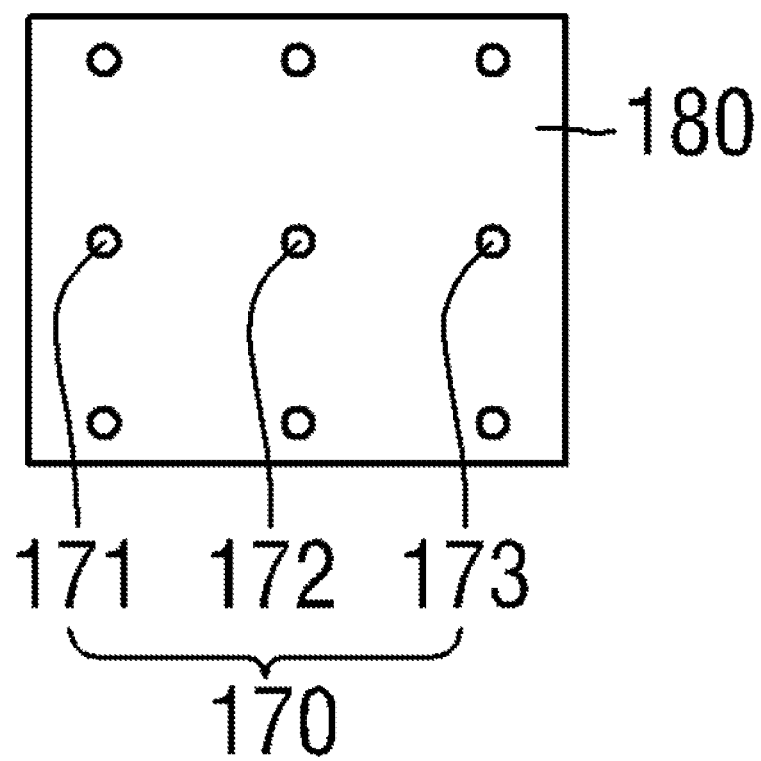
FIG. 3 is a plan view of a plurality of beam irradiators according to exemplary embodiments of the present inventive concepts.

FIG. 3 is a plan view of a plurality of beam irradiators 170 according to exemplary embodiments of the present inventive concepts.

Referring to FIG. 3, as described above, the beam irradiators 170 may penetrate through the beam irradiator fixing frame 180. The beam irradiators 170 may be arranged at regular intervals in a 2D structure. Due to this arrangement, each of the beam irradiators 170 can irradiate a beam or electrons to one corresponding mark. Consequently, the time required to correct the positions of the beam irradiators 170 may be reduced.

The shape of a detector according to embodiments of the present inventive concepts will now be described with reference to FIG. 4.

Figure 4:
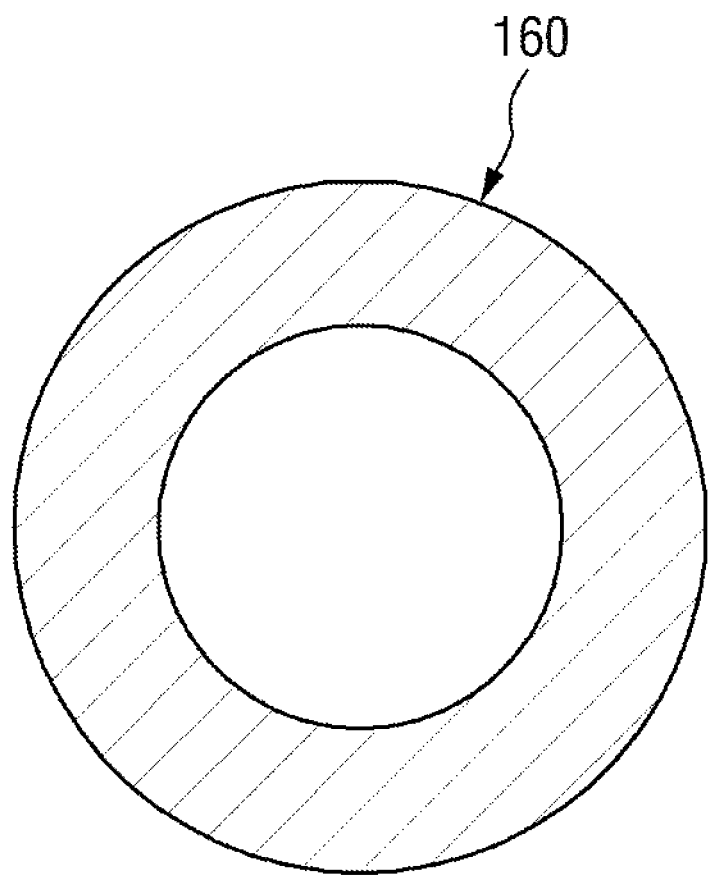
FIG. 4 is a plan view of a detector according to exemplary embodiments of the present inventive concepts.

FIG. 4 is a plan view of a detector 160 according to exemplary embodiments of the present inventive concepts.

Referring to FIG. 4, the detector 160 may be shaped like a disk having an opening. Due to this shape, the detector 160 can be disposed between the beam irradiators 170 and the stage 130.

For example, the detector 160 may not be disposed on a path along which beams or electrons irradiated by the beam irradiators 170 travel to reach the mark array 150. For example, the detector 160 may not block beams or electrons irradiated by the beam irradiators 170, so that the beams or electrons travel to reach the mark array 150. Accordingly, the beams or electrons irradiated by the beam irradiators 170 may not be received by the detector 160 but may directly reach the mark array 150.

The above described detector 160 may receive the beams or electrons reflected by the mark array 150. For example, the shape of detector 160 described above may be helpful to receive the beams or electrons reflected by the mark array 150. However, the inventive concepts are not limited thereto. For example, in some other embodiments, a part of the detector 160 may be disposed on the path along which the beams or electrons irradiated by the beam irradiators 170 travel to reach the mark array 150.

A stage according to embodiments of the present inventive concepts will now be described with reference to FIG. 5.

Figure 5:
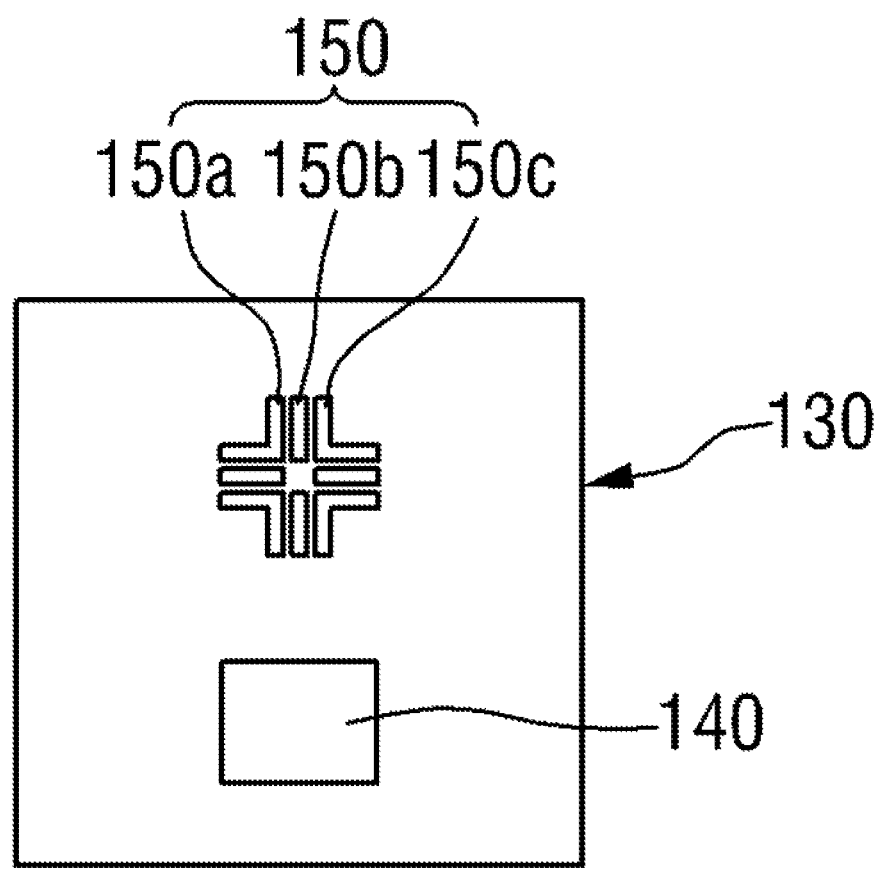
FIG. 5 is a plan view of a stage according to exemplary embodiments of the present inventive concepts.

FIG. 5 is a plan view of a stage 130 according to exemplary embodiments of the present inventive concepts.

Referring to FIG. 5, a mark array 150 and a substrate 140 may be disposed on the stage 130 to be separated from each other. The mark array 150 may include first through third marks 150a through 150c.

Each mark may be shaped like a line. As illustrated in FIG. 5, the mark array 150 may include eight marks arranged at regular intervals. However, the inventive concepts are not limited thereto. For example, in some other embodiments, the number of marks included in the mark array 150 may not be eight. The first through third marks 150a through 150c may lie on the same line.

A pitch W1 between the first and second marks 150a and 150b may be equal to a pitch W1 between the second and third marks 150b and 150c. Respective widths M1 through M3 of the first through third mask 150a through 150c may be equal to each other.

The first through third marks 150a through 150c may have different shapes. For example, the first mark 150a may be shaped like a bent line or an L shape lying in one direction, the second mark 150b may be shaped like a straight line, and the third mark 150c may be shaped like a line which is bent in an opposite direction from the first mark 150a or an L shape lying in another direction than the direction that the first mark 150a lies. The overall shape of the mark array 150 may be a cross shape.

When the beam irradiators 170 according to exemplary embodiments of the present inventive concepts irradiate beams to the mark array 150, the motion of the beams over time will now be described with reference to FIGS. 6 through 8.

Figure 6:
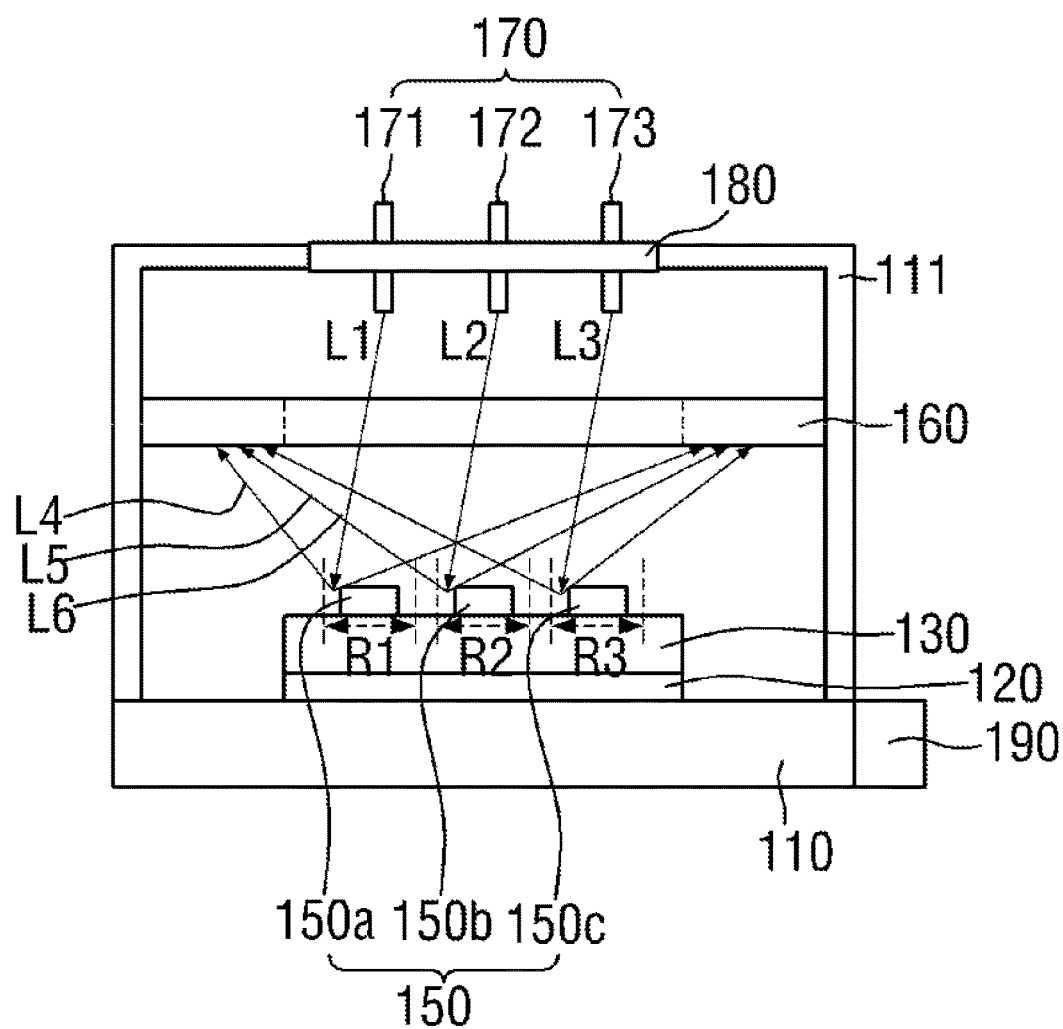
FIGS. 6 through 8 illustrate the motion of beams or electrons over time when a plurality of beam irradiators according to exemplary embodiments of the present inventive concepts irradiate the beams or electrons to a mark array.

FIG. 6 illustrates the motion of beams before the beam irradiators 170 irradiate the beams to the mark array 150. FIG. 7 illustrates the motion of beams when the beam irradiators 170 irradiate the beams to the mark array 150. FIG. 8 illustrates the motion of beams after the beam irradiators 170 irradiate the beams to the mark array 150.

The first beam irradiator 171 may irradiate a first beam L1, the second beam irradiator 172 may irradiate a second beam L2, and the third beam irradiator 173 may irradiate a third beam L3. However, the inventive concepts are not limited thereto. For example, in some exemplary embodiments of the present inventive concepts, the first beam irradiator 171 may irradiate a first set of electrons L1, the second beam irradiator 172 may irradiate a second set of electrons L2, and the third beam irradiator 173 may irradiate a third set of electrons L3. For example, the first, second, and third beams L1, L2, and L3 may be electron beams or light beams.

When the first through third beams L1 through L3 are irradiated to first through third regions R1 through R3, respectively, they may be irradiated in a direction perpendicular to a horizontal plane of the stage 130. In some embodiments, the first through third beams L1 through L3 may be irradiated obliquely to the horizontal plane of the stage 130.

An oblique beam irradiation may be made by changing the path of beams or electrons between the beam irradiators 170 and the mark array 150 using a beam inducer. Accordingly, as illustrated in FIGS. 6 through 8, the first through third beams L1 through L3 may scan the mark array 150 without a movement of the beam irradiators 170 and the stage 130.

The mark array region may include the first region R1 to which the first beam L1 is irradiated, the second region R2 to which the second beam L2 is irradiated, and the third region R3 to which the third beam L3 is irradiated.

Referring to FIG. 6, before the beam irradiators 170 irradiate beams to the mark array 150, the first beam L1 emitted from the first beam irradiator 171 may be irradiated to a region between an end of the first region R1 and the first mark 150a, the second beam L2 emitted from the second beam irradiator 172 may be irradiated to a region between an end of the second region R2 and the second mark 150b, and the third beam L3 emitted from the third beam irradiator 173 may be irradiated to a region between an end of the third region R3 and the third mark 150c.

The first beam L1 may be irradiated from the region between the end of the first region R1 toward the first mark 150a, the second beam L2 may be irradiated from the region between the end of the second region R2 toward the second mark 150b, and the third beam L3 may be irradiated from the region between the end of the third region R3 toward the third mark 150c.

A fourth beam L4 generated when the first beam L1 is reflected by the region between the end of the first region R1 and the first mark 150a may be received by the detector 160. A fifth beam L5 generated when the second beam L2 is reflected by the region between the end of the second region R2 and the second mark 150b may be received by the detector 160. A sixth beam L6 generated when the third beam L3 is reflected by the region between the end of the third region R3 and the third mark 150c may be received by the detector 160.

Figure 7:
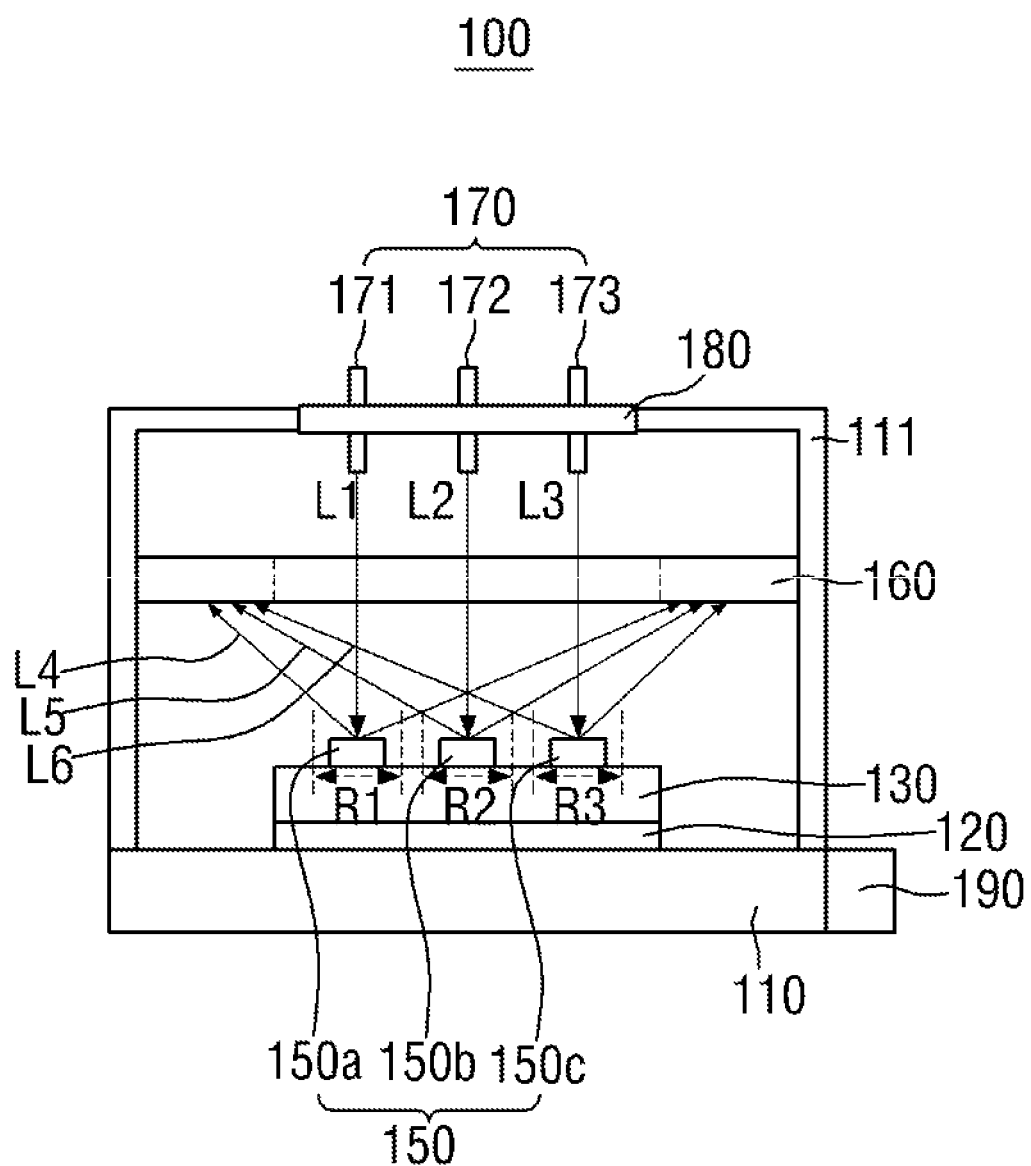

Referring to FIG. 7, when the beam irradiators 170 irradiate beams to the mark array 150, the first beam L1 may be irradiated to the first mark 150a, the second beam L2 may be irradiated to the second mark 150b, and the third beam L3 may be irradiated to the third mark 150c.

The first beam L1 may be irradiated toward the other end of the first region R1, the second beam L2 may be irradiated toward the other end of the second region R2, and the third beam L3 may be irradiated toward the other end of the third region R3.

A fourth beam L4 generated when the first beam L1 is reflected by the first mark 150a may be received by the detector 160. A fifth beam L5 generated when the second beam L2 is reflected by the second mark 150b may be received by the detector 160. A sixth beam L6 generated when the third beam L3 is reflected by the third mark 150c may be received by the detector 160.

Figure 8:
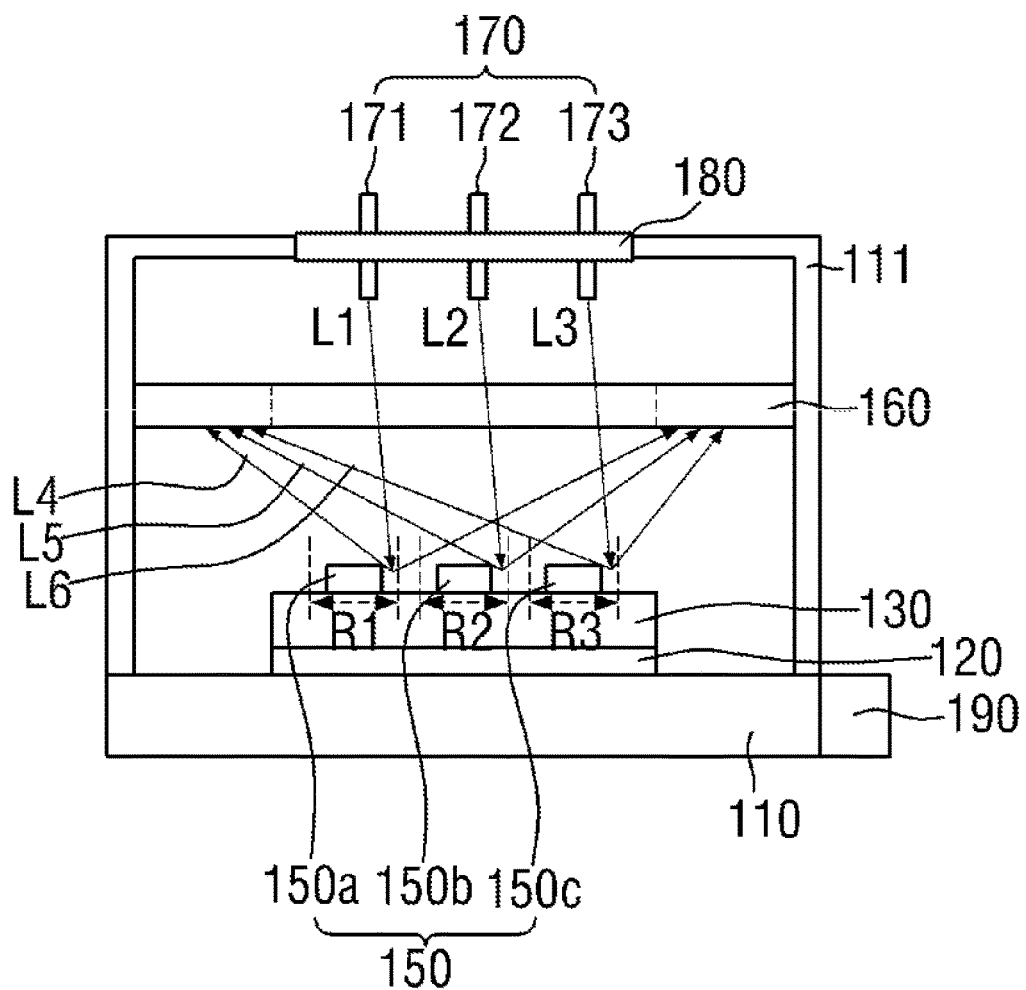

Referring to FIG. 8, after the beam irradiators 170 irradiate beams to the mark array 150, the first beam L1 may be irradiated to a region between the first mark 150a and the other end of the first region R1, the second beam L2 may be irradiated to a region between the second mark 150b and the other end of the second region R2, and the third beam L3 may be irradiated to a region between the third mark 150c and the other end of the third region R3.

A fourth beam L4 generated when the first beam L1 is reflected by a region between the first mark 150a and the other end of the first region R1 may be received by the detector 160. A fifth beam L5 generated when the second beam L2 is reflected by a region between the second mark 150b and the other end of the second region R2 may be received by the detector 160. A sixth beam L6 generated when the third beam L3 is reflected by a region between the third mark 150c and the other end of the third region R3 may be received by the detector 160.

After the detector 160 finishes receiving the fourth through sixth beams L4 through L6 described above, the scanning of the mark array region by the beam irradiators 170 may be terminated.

When each beam irradiator 170 scans one corresponding mark, the scan time may be reduced compared with a case when a plurality of beam irradiators 170 scan one mark. Consequently, the time required to correct the positions of the beam irradiators 170 may be reduced.

A method of manufacturing a semiconductor device using an exposure apparatus according to exemplary embodiments of the present inventive concepts will now be described with reference to FIG. 9.

Figure 9:
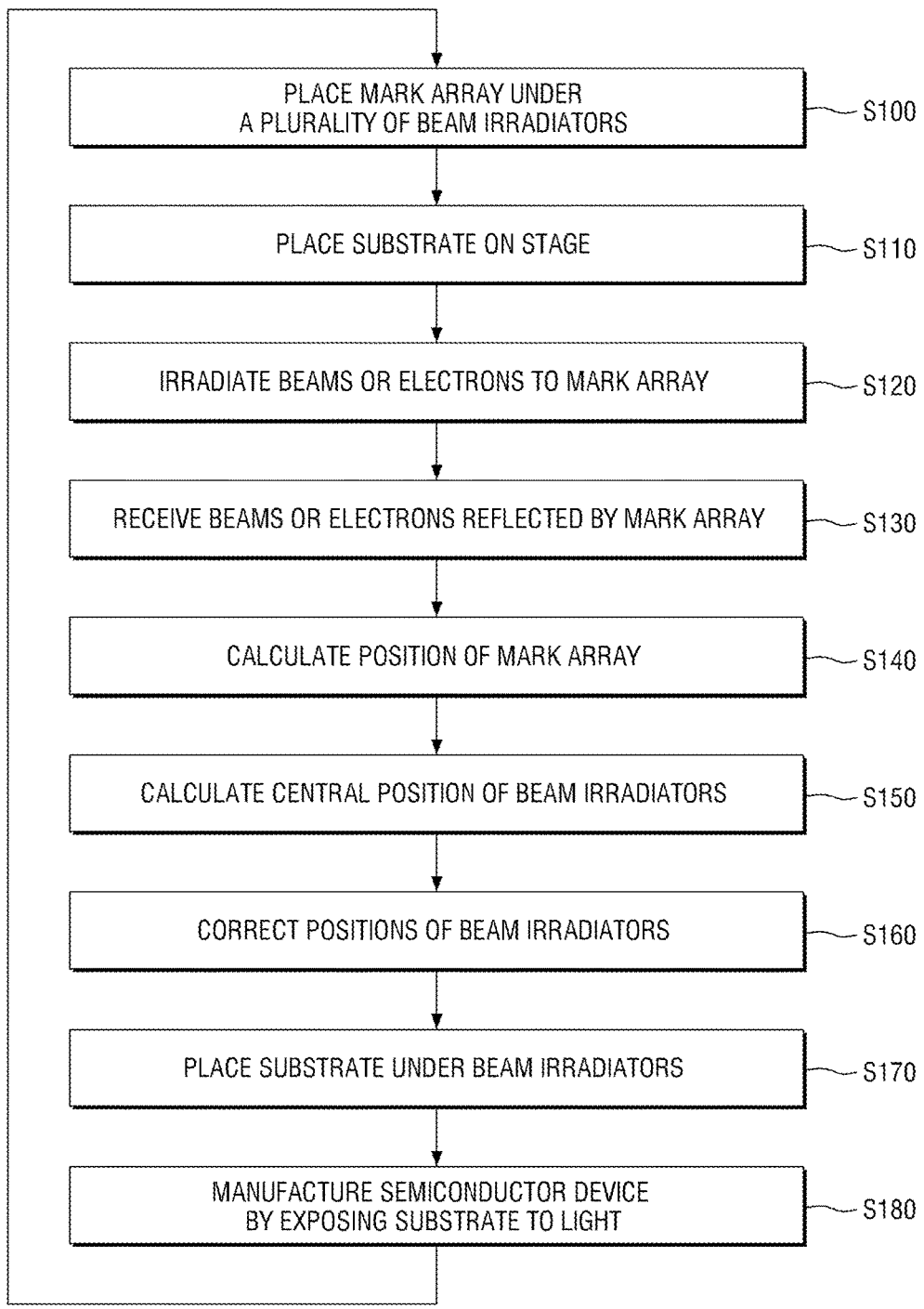
FIG. 9 is a flowchart sequentially illustrating a method of manufacturing a semiconductor device using an exposure apparatus according to exemplary embodiments of the present inventive concepts.

FIG. 9 is a flowchart sequentially illustrating a method of manufacturing a semiconductor device using an exposure apparatus according to exemplary embodiments of the present inventive concepts.

Referring to FIGS. 1 and 9, a mark array 150 may be placed under a plurality of beam irradiators 170 (operation S100). Accordingly, a process of correcting positions of the beam irradiators 170 may begin.

A substrate 140 may be provided on a substrate region of a stage 130 (operation S110). As described above, the substrate region in which the substrate 140 is placed and a mark array region in which a mark array 150 is placed may be separated from each other on the stage 130.

The beam irradiators 170 may irradiate beams or electrons to the mark array 150 placed thereunder (operation S120).

In this case, each of the beam irradiators 170 may irradiate a beam or electrons to a corresponding mark. For example, the number of the beam irradiators 170 may be equal to the number of marks, and one beam irradiator 170 may irradiate a beam to one corresponding mark. For example, a first beam irradiator 171 may irradiate a beam to a first mark 150a, a second beam irradiator 172 may irradiate a beam to a second mark 150b, and a third beam irradiator 173 may irradiate a beam to a third mark 150c.

Since each beam irradiator 170 scans one corresponding mark, the time required for the beam irradiators 170 to scan the mark array 150 may be reduced relatively. On the other hand, if a plurality of beam irradiators 170 scan one mark, since all of the beam irradiators 170 have to irradiate beams to one mark, the time required to scan marks may be increased relatively.

Therefore, the scan time of the mark array 150 of the exposure apparatus 100 according to embodiments of the present inventive concepts may be reduced, which, in turn, reduces the time required to perform an exposure process on a semiconductor device.

Beams or electrons reflected by the mark array 150 may be received by a detector 160 (operation S130). The detector 160 may be placed between the beam irradiators 170 and the stage 130. The detector 160 may be shaped like a disc having an opening in its center portion. Therefore, the detector 160 may not be placed on a beam path. For example, the detector may be placed not to block the beam path. The detector 160 may output information about the received beams or electrons to a controller 190.

The controller 190 may calculate the position of the mark array 150 using the information received from the detector 160 (operation S140). For example, the controller 190 may calculate the position of each mark using x and y coordinates of each mark.

The controller 190 may calculate a central position of the beam irradiators 170 using the calculated position of the mark array 150 (operation S150). For example, the controller 190 may calculate x and y coordinates of each beam irradiator 170 using the x and y coordinates of a mark which corresponds to each beam irradiator 170. The controller 190 may calculate central coordinates of the beam irradiators 170 using the x and y coordinates of each beam irradiator 170.

The controller 190 may correct the positions of the beam irradiators 170 using the central coordinates of the beam irradiators 170, such that the positions of the beam irradiators 170 correspond to the central coordinates of the mark array 150 (operation S160).

For example, the controller 190 may calculate a difference value between the central coordinates of the beam irradiators 170 and the central coordinates of the mark array 150. When the substrate 140 is positioned under the beam irradiators 170, the beam irradiators 170 may be placed above the substrate 140 in view of the difference value between the central coordinates of the beam irradiators 170 and the central coordinates of the mark array 150.

The controller 190 may place the substrate 140 under the beam irradiators 170 by controlling a transfer unit 120 in view of the difference value between the central coordinates of the beam irradiators 170 and the central coordinates of the mark array 150 (operation S170). For example, the substrate 140 may be placed in a position shifted a particular distance from a standard position, the particular distance being as much as the difference between the central coordinates of the beam irradiators 170 and the central coordinates of the mark array 150, and the particular distance in a direction opposite to the direction of the difference value. Accordingly, the position correction of the beam irradiators 170 may be completed.

After the position correction of the beam irradiators 170 is completed, the beam irradiators 170 may expose the substrate 140 to light by irradiating beams to the substrate 140 (operation S180). For example, the beam irradiators 170 may be configured to irradiate beams to the substrate 140 after the position correction of the beam irradiators 170 is completed.

After the exposure process, the transfer unit 120 may move the stage 130 to position the mark array 150 under the beam irradiators 170 (operation S100). Then, the above operations S100 through 180 may be repeated. The exposure apparatus 100 can manufacture a semiconductor device by repeating these operations S100 through S180.

A stage according to another exemplary embodiment of the present inventive concepts will now be described with reference to FIG. 10. The present embodiment will hereinafter be described, focusing mainly on differences with the embodiment of FIG. 5.

Figure 10:
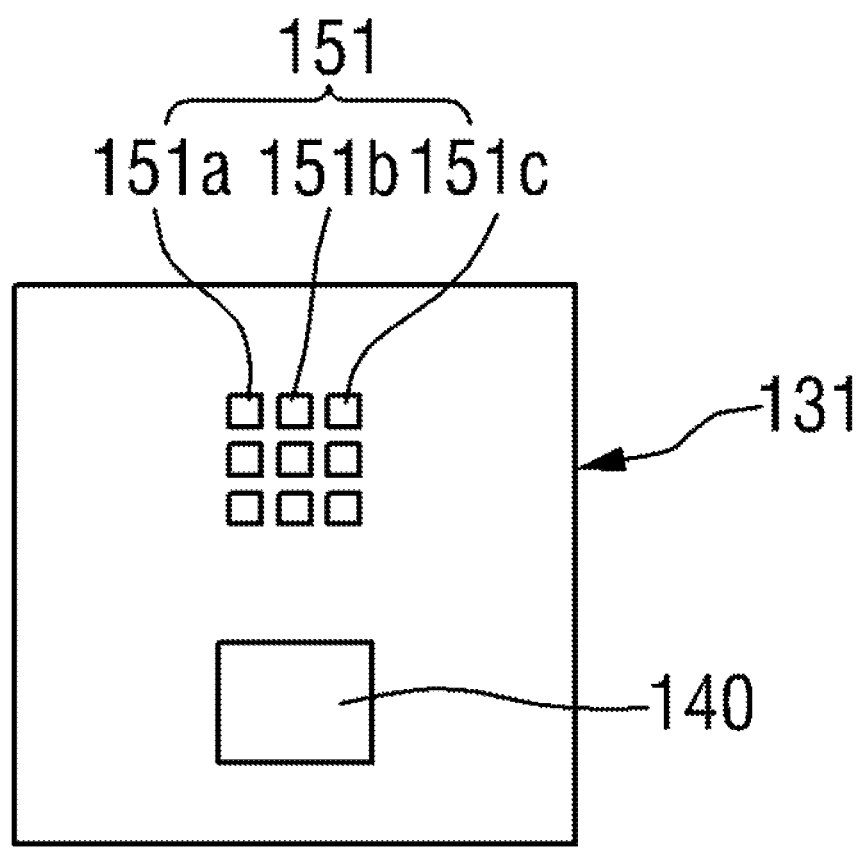
FIG. 10 is a plan view of a stage according to another exemplary embodiment of the present inventive concepts.

FIG. 10 is a plan view of a stage 131 according to another exemplary embodiment of the present inventive concepts.

Referring to FIG. 10, a mark array 151 and a substrate 140 may be disposed on the stage 131 to be separated from each other. The mark array 151 may include first through third marks 151a through 151c.

Each mark may be shaped like a dot. In FIG. 10, the mark array 151 includes nine marks arranged at regular intervals. However, the inventive concepts are not limited thereto. For example, in some other embodiments, the mark array 151 may include a number of marks other than nine. The first through third marks 151a through 151c may lie on the same line.

A stage according to another exemplary embodiment of the present inventive concepts will now be described with reference to FIG. 11. The present embodiment will hereinafter be described, focusing mainly on differences with the embodiment of FIG. 5.

Figure 11:
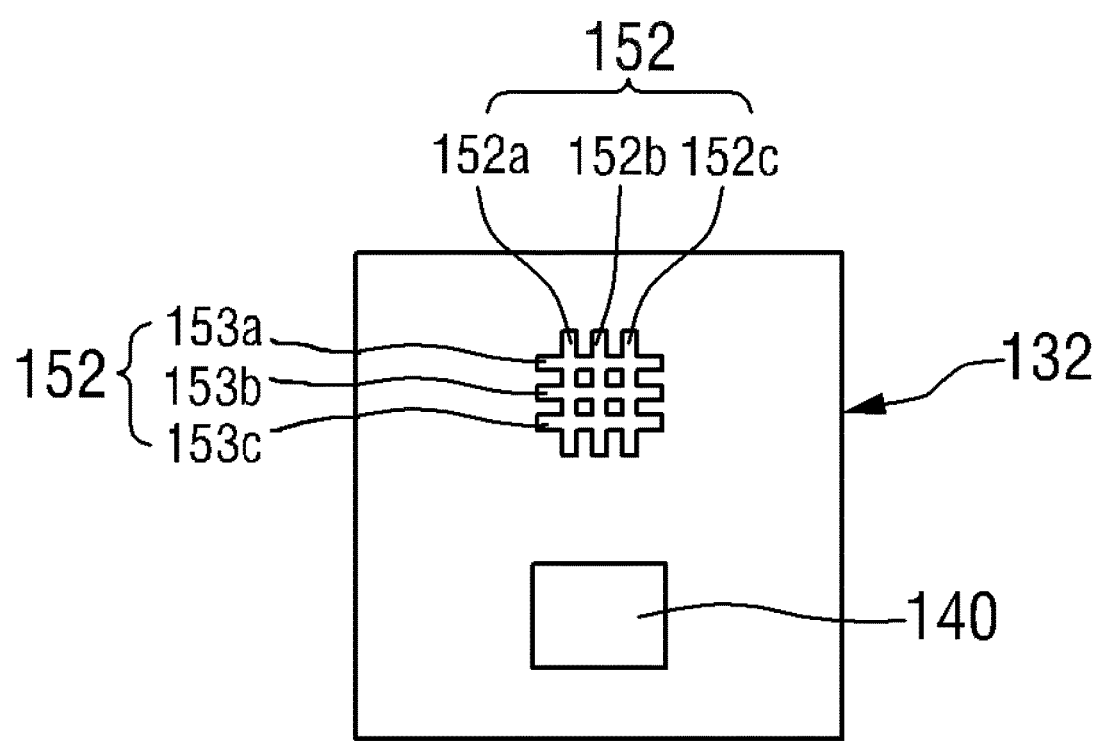
FIG. 11 is a plan view of a stage according to another exemplary embodiment of the present inventive concepts.

FIG. 11 is a plan view of a stage 132 according to another exemplary embodiment of the present inventive concepts.

Referring to FIG. 11, a mark array 152 and a substrate 140 are disposed on the stage 132 to be separated from each other. The mark array 152 may include first through third marks 152a through 152c and fourth through sixth marks 153a through 153c.

In the mark array 152 of FIG. 11, the first through third marks 152a through 152c are arranged at regular intervals, and the fourth through sixth marks 153a through 153c intersect the first through third marks 152a through 152c and are arranged at regular intervals.

Accordingly, the first through third marks 152a through 152c and the fourth through sixth marks 153a through 153c may form a net shape. However, the inventive concepts are not limited thereto. For example, in some other embodiments, a different number of marks may be provided.

An exposure apparatus according to another exemplary embodiment of the present inventive concepts will now be described with reference to FIG. 12. The present embodiment will hereinafter be described, focusing mainly on differences with the embodiment of FIG. 2.

Figure 12:
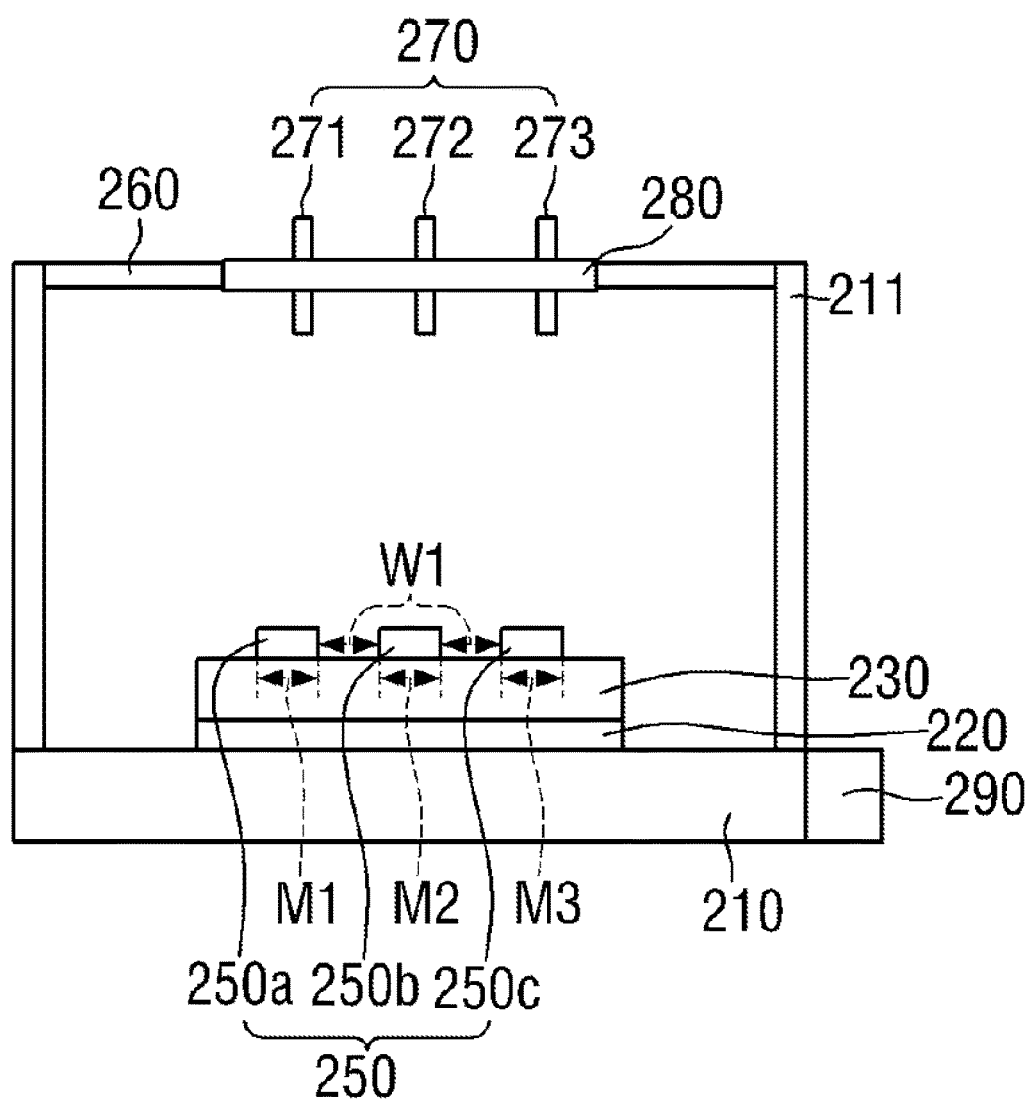
FIG. 12 is a cross-sectional view of an exposure apparatus according to another exemplary embodiment of the present inventive concepts.

FIG. 12 is a cross-sectional view of an exposure apparatus 200 according to another exemplary embodiment of the present inventive concepts.

Referring to FIG. 12, the exposure apparatus 200 may include a base frame 210, a connection frame 211, a transfer unit 220, a stage 230, a mark array 250, a detector 260, a plurality of beam irradiators 270, a beam irradiator fixing frame 280, and a controller 290.

The detector 260 may be disposed over the stage 230 to be separated from the stage 130. For example, the detector 260 may be disposed on side surfaces of the beam irradiators 270 to surround the beam irradiator fixing frame 280.

The detector 260 may be directly connected to side surfaces of the beam irradiator fixing frame 280. In some embodiments, the detector 260 may be directly connected to the connection frame 211 and thus fixed over the stage 230. For example, the beam irradiator fixing frame 280 may be directly connected to, and thus supported by the detector 260 which may be directly connected to and supported by the connection frame 211. However, the inventive concepts are not limited thereto. For example, in some other embodiments, the beam irradiator fixing frame 280 may be directly connected to the connection frame 211 and thus fixed over the stage 230. In some embodiments, the detector 260 may be directly connected and fixed to the side surfaces of the beam irradiator fixing frame 280.

The detector 260 may be disposed on the side surfaces of the beam irradiators 270. Therefore, the detector 260 may not be disposed on a path along which beams or electrons irradiated from the beam irradiators 270 travel to reach the mark array 250. Accordingly, the detector 260 may not receive the beams or electrons irradiated by the beam irradiators 270 but receive beams or electrons reflected by the mark array 250.

While aspects of the present inventive concepts have been particularly shown and described with reference to exemplary embodiments thereof, it will be understood by those of ordinary skill in the art that various changes in form and details may be made therein without departing from the spirit and scope of the present disclosure. The exemplary embodiments should be considered in a descriptive sense only and not for purposes of limitation.

What is claimed is:

1. An exposure apparatus comprising:
   a stage configured to receive a substrate;
   a mark array disposed on the stage and comprising a first mark and a second mark separated from each other by a first distance;
   a first beam irradiator configured to irradiate a first beam to the first mark;
   a second beam irradiator configured to irradiate a second beam, which is separated from the first beam by a pitch greater than the first distance, to the second mark;
   a detector disposed over the mark array and configured to receive a third beam reflected by the first mark and a fourth beam reflected by the second mark; and
   a controller configured to control a position of the stage using an output of the detector,
   wherein the first mark and the second mark have different shapes from each other.

2. The exposure apparatus of claim 1, wherein the controller is configured to receive scan information of the first mark and the second mark from the detector, calculate positions of the first mark and the second mark, and calculate a central position of the first and second beam irradiators using position information of the first mark and the second mark.

3. The exposure apparatus of claim 2, further comprising a transfer unit configured to move the stage using the central position of the first and second beam irradiators such that the substrate is positioned under the first and second beam irradiators.

4. The exposure apparatus of claim 3, wherein the controller is configured to control the transfer unit.

5. The exposure apparatus of claim 1, wherein a width of the first mark is equal to a width of the second mark.

6. The exposure apparatus of claim 5, wherein a sum of the width of the first mark and the first distance is equal to the pitch between the first beam and the second beam.

7. The exposure apparatus of claim 1, wherein each width of a region to which the first beam is irradiated and a width of a region to which the second beam is irradiated are equal to or smaller than the pitch between the first beam and the second beam.

8. The exposure apparatus of claim 1, wherein the first mark and the second mark include a metal that reflects electrons, and the detector is configured to receive a first set of electrons reflected by the first mark and a second set of electrons reflected by the second mark, wherein the metal includes at least one of Ta, W, Pt, Au, and Pb.

9. The exposure apparatus of claim 1, wherein the detector is disposed between the first and second beam irradiators and the mark array and shaped like a disk having an opening.

10. The exposure apparatus of claim 1, wherein the mark array further comprises a third mark,
wherein the first mark, the second mark and the third mark have different shapes from each other.

11. The exposure apparatus of claim 10, wherein the first mark has an L shape lying in a first direction, the second mark has a straight line shape, and the third mark has an L shape lying in a second direction different from the first direction.

12. The exposure apparatus of claim 10, wherein the first mark, the second mark and the third mark have semi-circular shapes in cross-sectional views.

13. The exposure apparatus of claim 1, wherein the first mark and the second mark have different widths from each other.

14. The exposure apparatus of claim 1, wherein the detector has an annular shape.

15. The exposure apparatus of claim 1, wherein the first and second beam irradiators are configured to irradiate the respective first and second marks at a same time.

16. The exposure apparatus of claim 1, wherein the first mark has an L shape and the second mark has a straight line shape.

* * * * *